(12) United States Patent
Duce et al.

(10) Patent No.: US 7,305,599 B1
(45) Date of Patent: Dec. 4, 2007

(54) TESTING PROPAGATION DELAY OF A SHIFT REGISTER USING A RING OSCILLATOR

(75) Inventors: Richard D. J. Duce, San Jose, CA (US); Himanshu J. Verma, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 175 days.

(21) Appl. No.: 11/158,524

(22) Filed: Jun. 22, 2005

(51) Int. Cl.
G01R 31/28 (2006.01)

(52) U.S. Cl. ...................................... 714/724
(58) Field of Classification Search ............... None
See application file for complete search history.

(56) References Cited

U.S. PATENT DOCUMENTS

| | | | |
|---|---|---|---|
| 5,790,479 A | 8/1998 | Conn | |
| 6,075,418 A | 6/2000 | Kingsley et al. | |
| 6,105,153 A * | 8/2000 | Yamada | 714/724 |
| 6,144,262 A | 11/2000 | Kingsley | |
| 6,219,305 B1 * | 4/2001 | Patrie et al. | 368/113 |
| 6,232,845 B1 | 5/2001 | Kingsley et al. | |
| 6,452,459 B1 | 9/2002 | Chan et al. | |
| 6,535,013 B2 * | 3/2003 | Samaan | 324/765 |
| 2002/0084797 A1 * | 7/2002 | Samaan | 324/765 |

* cited by examiner

Primary Examiner—Cynthia Britt
Assistant Examiner—Merant Guerrier
(74) Attorney, Agent, or Firm—W. Eric Webostad

(57) ABSTRACT

Testing signal propagation delay of a shift register circuit is described. A ring oscillator has a first sequential element, a second sequential element, and a shift register circuit. The shift register circuit is coupled in series between the first sequential element and the second sequential element. The shift register circuit includes the at least one shift register and combinational logic coupled to the at least one shift register. The at least one shift register is configured to store a test data pattern of alternating logic ones and zeros. The combinational logic is coupled to receive a data signal from the first sequential element of the ring oscillator and coupled to receive a shift output signal from the at least one shift register. The combinational logic is configured to provide an exclusive logic function.

20 Claims, 5 Drawing Sheets

TESTING PROPAGATION DELAY OF A SHIFT REGISTER USING A RING OSCILLATOR

FIELD OF THE INVENTION

One or more aspects of the invention relate generally to integrated circuits and, more particularly, to testing signal propagation delay of a shift register.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA available from Xilinx, Inc., 2100 Logic Drive, San Jose, Calif. 95124. Another such FPGA, the Xilinx Virtex®-II FPGA available from Xilinx, Inc., 2100 Logic Drive, San Jose, Calif. 95124. And yet another such FPGA is the Xilinx Virtex-II Pro™ FPGA available from Xilinx, Inc., 2100 Logic Drive, San Jose, Calif. 95124.

Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Signal propagation delay of a circuit under test may be tested by placing such a circuit under test within a ring oscillator, as described in additional detail in U.S. Pat. Nos. 6,452,459, 6,232,845, 6,219,305, 6,144,262, 6,075,418, and 5,790,479, collectively and singly referred to as the "Kingsley ring oscillator." The Kingsley ring oscillator facilitates testing of signal propagation delay in part by being non-inverting. Thus, clock-to-out delay of a circuit under test may be tracked as a leading edge of an input signal tracks with a leading edge of a data output signal of the circuit under test.

However, this advantage has heretofore precluded testing propagation delay of shift registers. As is known, a rising-edge-triggered shift register having a 0101010101010101 data storage pattern may output a logic 1 responsive to a rising edge of an input clock signal, but on the next rising edge such output will be a logic 0. In other words, in this example, the next rising edge tracks to a falling edge of the output of the shift register.

Accordingly, it would be desirable and useful to provide means to test signal propagation delay of a shift register with edge polarity tracking from data input to data output.

SUMMARY OF THE INVENTION

One or more aspects of the invention generally relate to integrated circuits and, more particularly, to testing signal propagation delay of a shift register.

An aspect of the invention is an integrated circuit configured for testing signal propagation delay of at least one shift register. A ring oscillator has a first sequential element, a second sequential element, and a shift register circuit. The shift register circuit is coupled in series between the first sequential element and the second sequential element. The shift register circuit includes the at least one shift register and combinational logic coupled to the at least one shift register. The at least one shift register is configured to store a test data pattern of alternating logic ones and zeros. The combinational logic is coupled to receive a data signal from the first sequential element of the ring oscillator and coupled to receive a shift output signal from the at least one shift register. The combinational logic is configured to provide an exclusive OR or an exclusive NOR function. The at least one shift register is coupled to receive output from the combinational logic to clock the at least one shift register. The at least one shift register is coupled to receive the shift output signal from the at least one shift register as a fed back shift input signal. The second sequential element is coupled to receive the shift output signal to clock the second sequential element.

Another aspect of the invention is an integrated circuit configured for signal testing propagation delay of at least a portion of a chain of shift registers. A ring oscillator has a first sequential element, a second sequential element, and a chain of shift register circuits. The chain of shift register circuits is respective shift register circuits coupled in series between the first sequential element and the second sequential element. Each of the shift register circuits includes at least one shift register and combinational logic coupled to the at least one shift register. The at least one shift register of each of the shift register circuits is configured to store a test data pattern of alternating logic ones and zeros. The combinational logic of each of the shift register circuits is coupled to receive a respective data signal and coupled to receive a respective shift output signal from the at least one shift register associated with a shift register circuit of the shift register circuits in which the combinational logic is located. The combinational logic of each of the shift register circuits is configured to provide an exclusive logic function. An initial shift register circuit in the chain of shift register circuits is coupled to receive the respective data signal from a data output port of the first sequential element of the ring oscillator. Each subsequent shift register circuit to the initial shift register circuit in the chain of shift register circuits is coupled to receive the respective data signal from an immediately previous one of the shift register circuits in the chain of shift register circuits. The at least one shift register of each of the shift register circuits is coupled to receive output from the combinational logic associated therewith to clock the at least one shift register. The at least one shift register of each of the shift register circuits is respectively coupled to receive the shift output signal from the at least one shift register as a respective fed back shift input signal. The second sequential element is coupled to receive the shift output signal of a last shift register circuit in the chain of shift register circuits to a clock port of the second sequential element.

Yet another aspect of the invention is a method for testing signal propagation delay of a shift register. A configurable logic block is programmably configured to provide a shift register. The shift register is programmably coupled to combinational logic configured to provide an exclusive logic function. The exclusive logic function is selected from an exclusive-OR function and an exclusive-NOR function. The shift register and the combinational logic in combination form a test circuit. The test circuit is programmably coupled between sequential elements to provide at least a portion of a ring oscillator. The shift register is initialized with a test pattern. A data input signal is sent from the first sequential element to a first input of the combinational logic. A shift output signal is sent from the shift register to a shift input port of the shift register, to a second input of the combinational logic, and to a clock port of the second sequential element. A clock signal is generated from output of the combinational logic responsive to the shift output signal and the data input signal. The shift register is clocked responsive to the clock signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
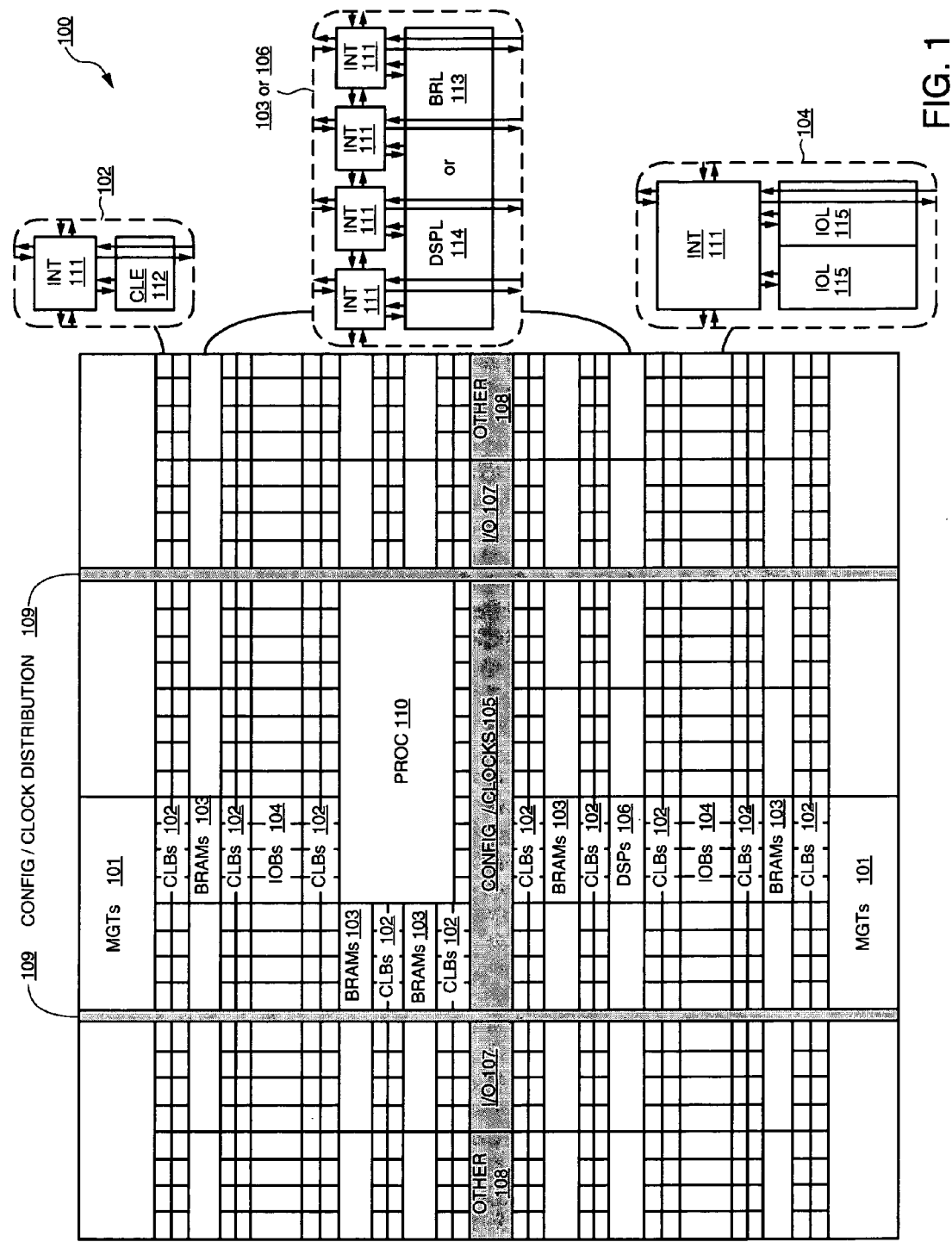
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1. In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
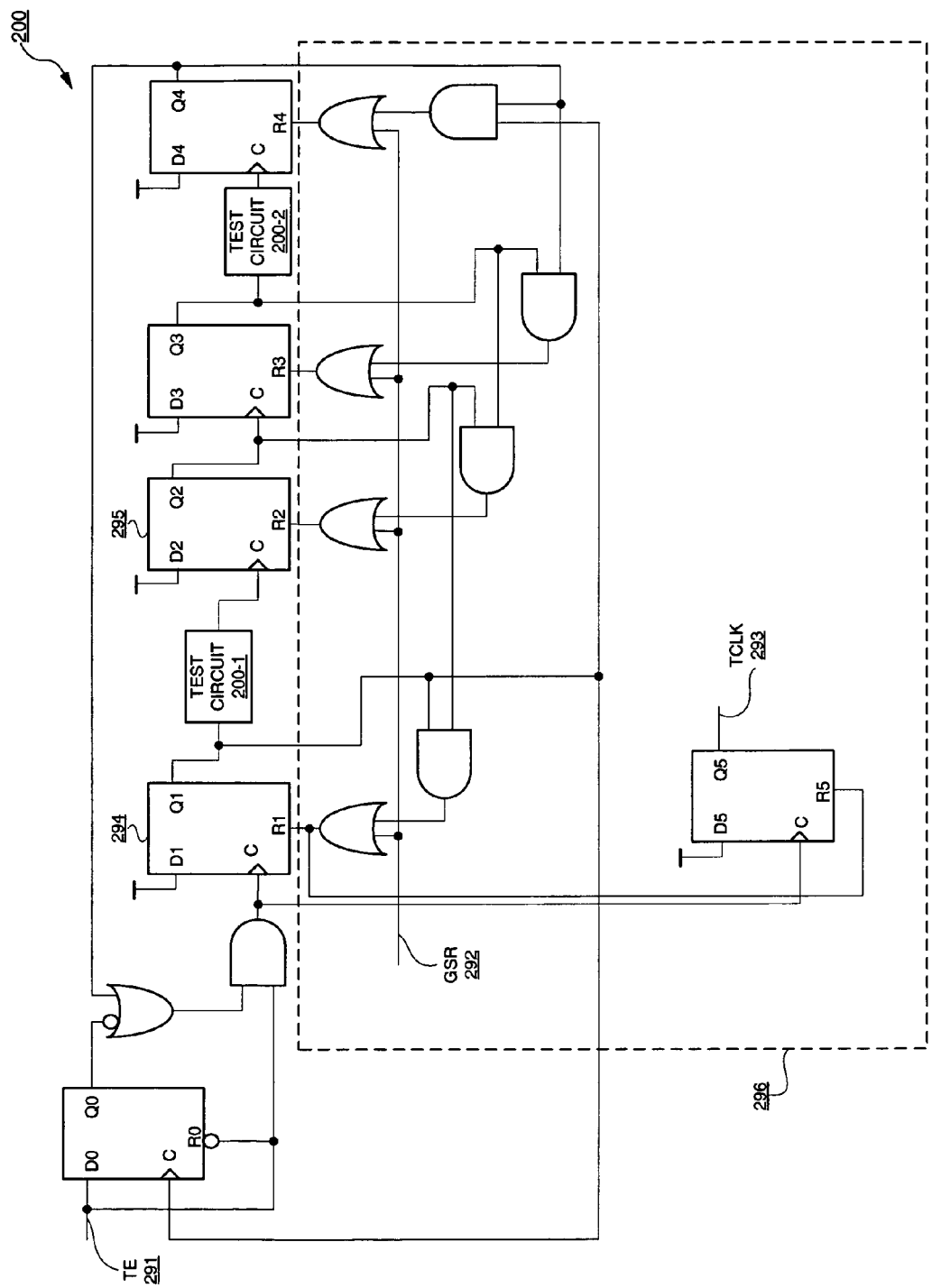
FIG. 2 is a block/schematic diagram depicting an exemplary embodiment of a ring oscillator having two test circuits.

FIG. 2 is a block/schematic diagram depicting an exemplary embodiment of a known ring oscillator 200 having test circuits 200-1 and 200-2. A test activation signal ("TE") 291 and a global set/reset signal ("GSR") 292 may be applied to ring oscillator 200. Ring oscillator 200 may output a test clock signal ("TCLK") 293. Notably, only one test circuit, such as test circuit 200-1, may be included in ring oscillator 200. Test circuit 200-1 may be coupled between flip-flop 294 and 295. Additional details regarding ring oscillator 200 may be found in the Kingsley ring oscillator patents. Notably, all or a part of circuitry 296 may be omitted as described below in additional detail.

Figure 3:
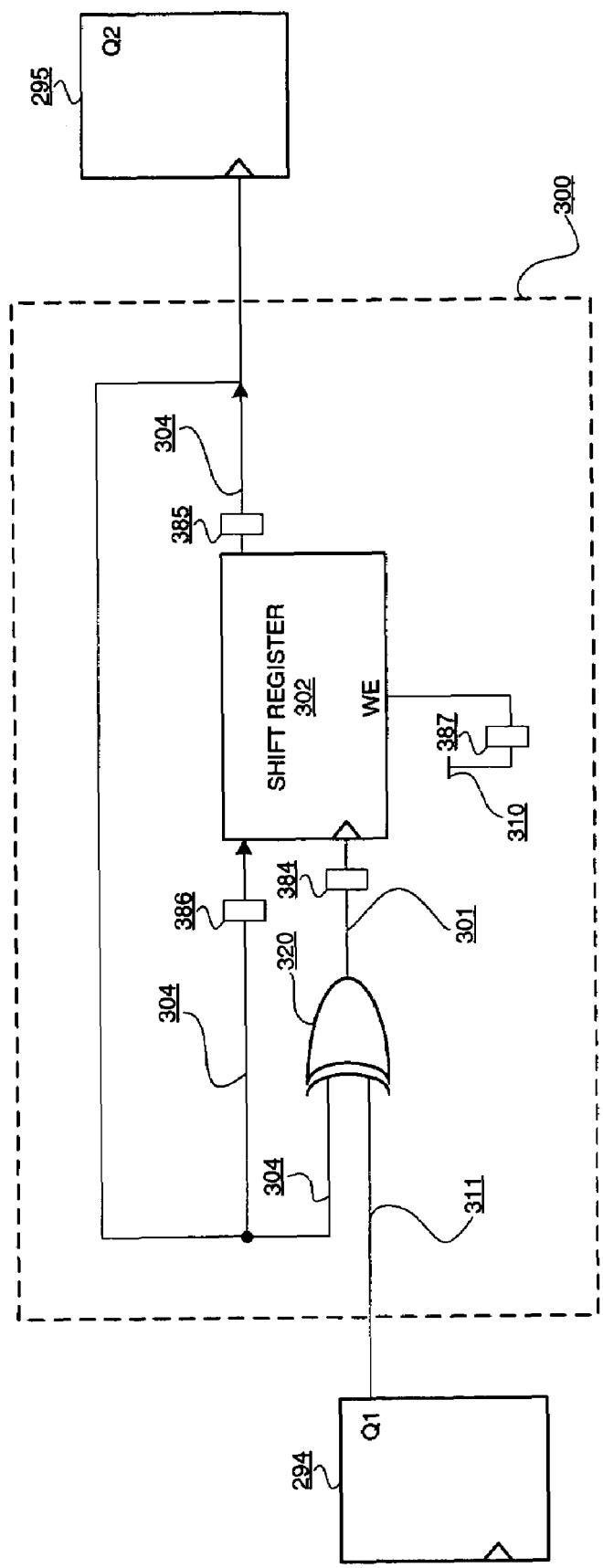
FIG. 3 is a block/schematic diagram depicting an exemplary embodiment of a shift register circuit under test, which may be a test circuit of FIG. 2.

FIG. 3 is a block/schematic diagram depicting an exemplary embodiment of a shift register circuit under test 300, which may be inserted as test circuit 200-1 of FIG. 2. Shift register circuit under test 300 is coupled to receive output from flip-flop 294 via exclusive-OR ("XOR") gate 320. Though an XOR gate 320 is illustratively shown, it should be appreciated from the description that follows that an exclusive-NOR ("XNOR") gate may be used instead of an XOR gate. In other embodiments, any combinational logic which is logically equivalent to a XOR or XNOR function may be used. Furthermore, though the description that follows is described in terms of rising-edge-triggered shift registers and flip-flops, it should be appreciated that falling-edge-triggered shift registers and flip-flops may be used.

Data output signal 311 input to XOR gate 320 is a test data input; however, prior to electrically coupling test data input 311 to shift register circuit under test 300, contents of shift register 302 are initialized. This initialization may be done during configuration of an integrated circuit in which shift register 302 is located. For purposes of clarity by way of example and not limitation, it shall be assumed that shift register 302 is a shift register formed of programmably configurable logic of a programmable logic device ("PLD"), and such initialization of shift register 302 is done during configuration of such PLD. Furthermore, for purposes of clarity by way of example and not limitation, such PLD shall be described in terms of an FPGA. Although the description that follows is in terms of an FPGA, it should be understood that any integrated circuit having programmably configurable logic which may be used to instantiate a shift register may be used.

In this example, shift register 302 is initialized with a logic pattern. For purposes of clarity by way of example and not limitation, it shall be assumed that shift register 302 is a 16-bit shift register, and the data pattern loaded into shift register 302 is a 1010101010101010 pattern. However, it will be immediately appreciated that fewer or more bits, namely a shorter or longer shift register, may be implemented. Notably, the Most Significant Bit ("MSB") location is on the far right, such as a logic 0 in the above example bit pattern, and the Least Significant Bit ("LSB") location is on the far left, such as a logic 1 in the above example bit pattern.

Another input to XOR gate 320 is data shift output 304, which is output from shift register 302. Data shift output 304 is fed back within shift register circuit under test 300 as both an input to XOR gate 320 and as a data shift input to shift register 302. Output of XOR gate 320 is provided as a clock signal 301 to a clock port of shift register 302. Furthermore, a write enable port of shift register 302 may be coupled to a logic level, such as a logic high level 310, to maintain shift register 302 in a write active state during testing of shift register circuit under test 300. Thus, it should be appreciated that one input of XOR gate 320, namely data input signal 311, is associated with a signal circularly traversing a ring oscillator while the other input to XOR gate 320, namely data shift input signal 304, is associated with output of shift register 302. Notably, the terms data shift input signal 304 and data shift output signal 304 are the same signal; however, the more appropriate term is used to be in keeping with the context of the description. In an embodiment, the MSB of shift register 302 may be shifted out therefrom responsive to clock signal 301 to provide data shift input signal 304. In this particular example, the MSB is bit 15 of shift register 302.

With renewed reference to FIG. 2 and continuing reference to FIG. 3, shift register circuit under test 300 is further described. As described below in additional detail with reference to a timing diagram, data shift input 304 is used to translate a falling edge of a ring oscillator traversing signal, such as data input signal 311, into a pulse for clocking shift register 302 to circulate alternating 0101010101010101 or 1010101010101010 data test patterns. This circulation of data test patterns is done internal to shift register circuit under test 300 responsive to an active edge of data input signal 311, whether a leading or a falling edge, for clocking shift register 302. Accordingly, it should be appreciated that clearing, setting, or resetting ("resetting") of shift register 302 need not involve feeding back a signal from a downstream flip-flop, as in ring oscillator 200 of FIG. 2, and thus resetting of elements of test circuits 200-1 and 200-2 of FIG. 2 may be independent of one another. Moreover, capability of independent resets may reduce likelihood of encountering a race condition.

Referring back to FIG. 2, it should be appreciated that ganged reset signal application may be avoided. Furthermore, the reduction of the likelihood of encountering a race condition by providing independent set/reset control for synchronous elements facilitates concatenating more of such synchronous elements to shift register 302. In other words, there is less of an issue with respect to setting or resetting synchronous elements all within a limited time window.

Figure 4:
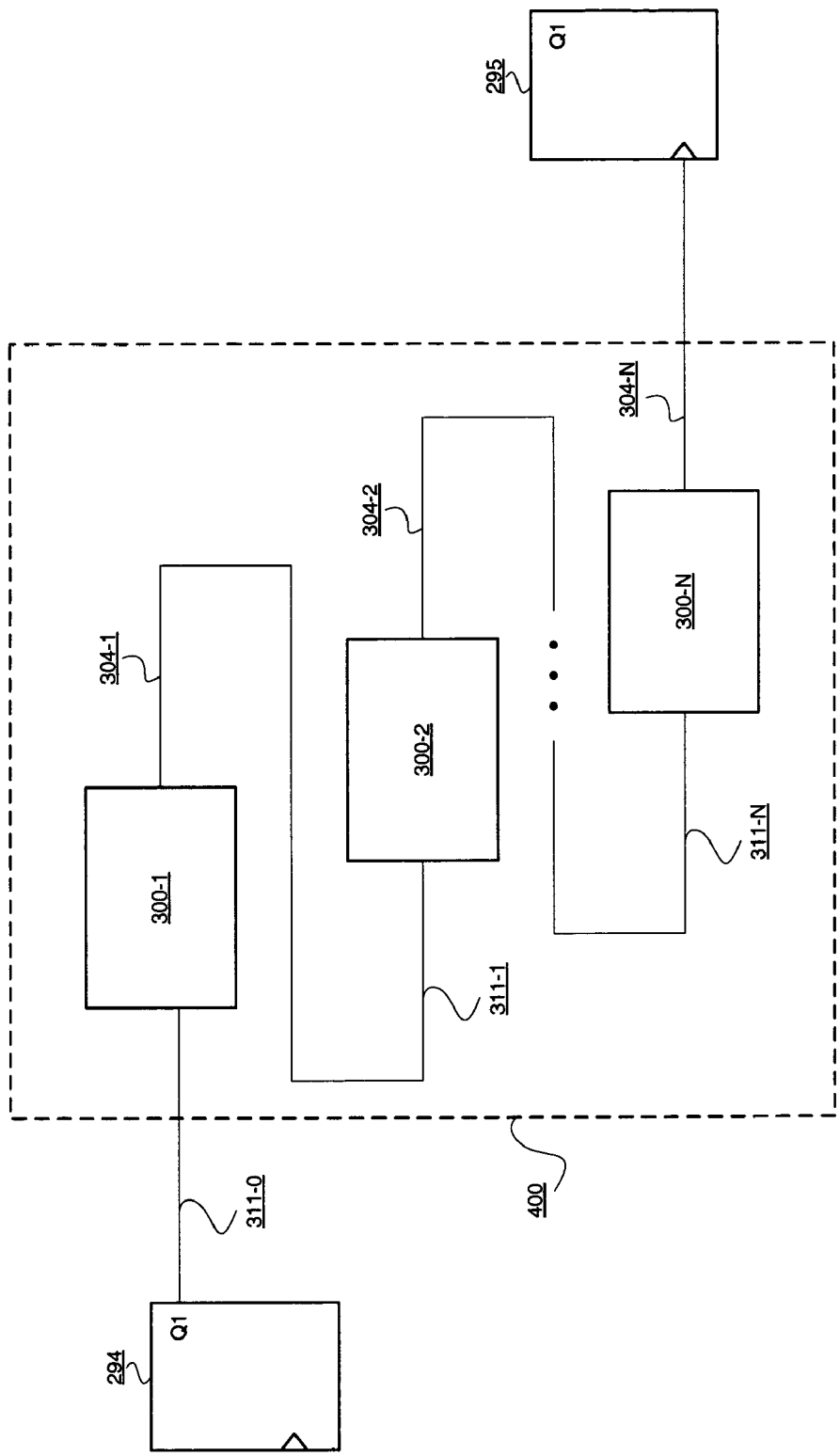
FIG. 4 is a schematic/block diagram depicting an exemplary embodiment of a chain of shift register circuits under test.

Referring to FIG. 4, there is shown a schematic/block diagram depicting an exemplary embodiment of a chain of shift register circuits under test 400, having concatenated shift register circuits under test 300-1 through 300-N, for N a positive integer. In this exemplary embodiment, output from flip-flop 294, namely data input signal 311-0, is provided to a first-stage shift register circuit under test 300-1. Notably, the terms data input signal 311 and data output signal 311 are the same signal; however, the more appropriate term is used to be in keeping with the context of the description. Each of shift register circuits under test 300-1 through 300-N are according to the above-mentioned description of shift register circuit under test 300 of FIG. 3, and thus such description is not repeated here for purposes of clarity. Furthermore, it should be appreciated that shift register 302 in each of these stages may be of the same length or different lengths. The ability to add additional shift register stages facilitates increasing sensitivity to measuring signal propagation delay.

Output of shift register circuit under test 300-1, namely data shift output 304-1, is provided as data input signal 311-1 to an XOR or an XNOR gate of shift register circuit under test 300-2. Output of shift register circuit under test 300-2 is data shift output 304-2, which may be provided to the next-stage shift register circuit under test as a data input signal to an XOR or XNOR gate of that shift register circuit under test. Accordingly, data shift output signal may be provided to an Nth-stage shift register circuit under test 300-N as a data input signal 311-N to an XOR or XNOR gate of that shift register circuit under test. Output of the Nth-stage shift register circuit under test 300-N may be provided as data shift output signal 304-N, which is provided to clock flip-flop 295.

Figure 5:
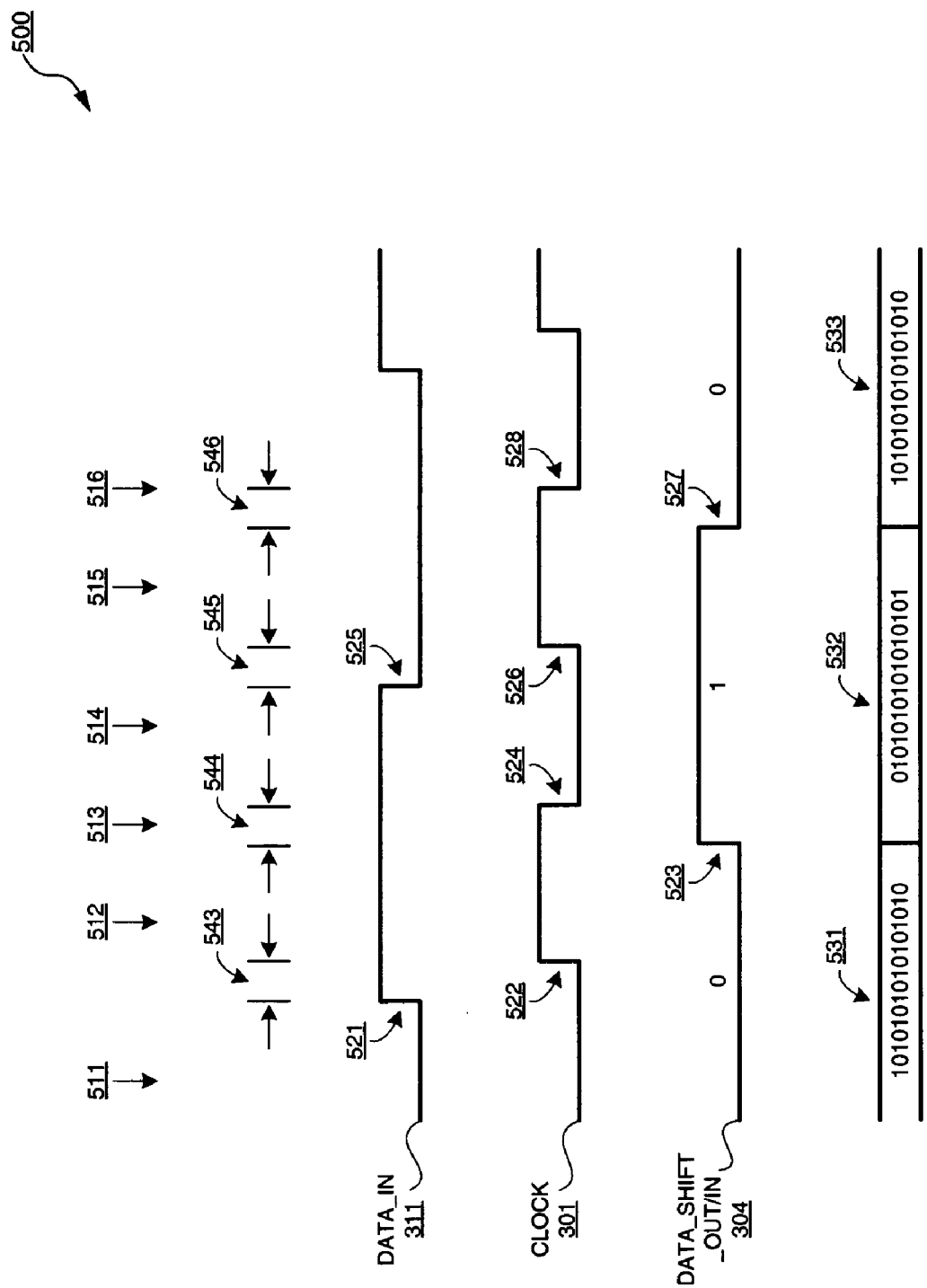
FIG. 5 is a timing diagram depicting an exemplary embodiment of signal timing for the shift register circuit under test of FIG. 3.

FIG. 5 is a timing diagram depicting an exemplary embodiment of signal timing for shift register circuit under test 300 of FIG. 3. With simultaneous reference to FIGS. 3 and 5, timing diagram 500 is described.

At time 511, data input signal 311 and data shift output/input signal 304 are each at a logic low level. Accordingly, clock signal 301 will be at a logic low level. At time 511, shift register 302 has already been initialized with bit pattern content 531, which may be 16 bits, such as 1010101010101010 for the above example. Responsive to rising edge 521 of data input signal 311, clock signal 301, after some delay 543, has an associated transition, as generally indicated by rising edge 522 of clock signal 301. Delay 543, as between edges 521 and 522, may be associated at least in part with signal propagation delay through XOR gate 320.

Generally at time 512, data input signal 311 is at a logic high level and data shift input signal 304 is at a logic low level, and thus clock signal 301 stays a logic high level causing a bit of test pattern data to be clocked out of shift register 302. This bit output is indicated by data shift output/input signal 304 transitioning from a logic low level to a logic high level, as generally indicated by rising edge 523. More particularly, by clocking shift register 302 responsive to clock signal 301, for clock signal 301 at a logic high level, shift register 302 will respond by providing a MSB on data shift output signal 304. This bit will alternate between being a logic 1 and a logic 0 as indicated in FIG. 5. For the above 16-bit data pattern example, this is generally indicated by shift register content 532 being a 0101010101010101 after output of the MSB logic 1 and input of an LSB logic 0 from the previous cycle, where the LSB appears on the extreme left of shift register content 532.

Thus, for a logic 1 output from shift register 302 and data input signal 311 being at a logic high level as generally indicated at time 513, output of XOR gate 320 transitions from a logic high level to a logic low level, namely clock signal 301 transitions from a logic high level to a logic low level as generally indicated by falling edge 524. Notably, delay 544, as between edges 523 and 524, may be associated with signal propagation delay, at least in part, through XOR gate 320 for this transition.

Generally at time 514, with data input signal 311 being at a logic high level and data shift input signal 304 being at a logic high level, clock signal 302 will be at a logic low level. Thus, shift register 302 does not output the next bit of data at time 514 because it is edge triggered and not level triggered.

Responsive to data input signal 311 transitioning from a logic high level to a logic low level as generally indicated by falling edge 525 and data shift input signal 304 being at a logic high level, clock signal 301 will transition from a logic low level to a logic high level as generally indicated by rising edge 526. Again, this transition as generally indicated by rising edge 526 may be some time, illustratively shown in FIG. 5 as delay 545, after falling edge 525 due to propagation delay, including in part delay through XOR gate 320.

Generally at time 515, continuing the above example, shift register content 532 is a data test pattern of 0101010101010101. Again, responsive to clock signal 301 clocking out a logic 1 from shift register 302, data shift input signal 304 will be at a logic high level. With data input signal 311 being at a logic low level, and data shift input signal 304 being at a logic high level generally at time 515, clock signal 301 will be at a logic high level. Thus, a logic 1 will be clocked into shift register's 302 LSB and the entire bit pattern shifts from the LSB to the MSB.

Data shift input signal 304 transitions from a logic high level to a logic low level indicating another MSB has been shifted out, as generally indicated by falling edge 527 of data shift input signal 304 indicating shifting out of a logic 0 responsive to a rising edge of clock signal 301. Responsive to data shift input signal 304 being at a logic low level and data input signal 311 being at a logic low level generally at time 516, clock signal 301 transitions from a logic high level to a logic low level as generally indicated by falling edge 528. Again, delay 546 between edges 527 and 528 may be due at least in part to signal propagation delay through XOR gate 320. Thus, it should be appreciated that shift register content, as generally indicated by data test patterns 531, 532, and 533, sequentially shifts out either a logic 1 or a logic 0 and correspondingly shifts in either a logic 1 or a logic 0. Notably, delays 543 through 546 may each be approximately the same duration.

Thus, it should be appreciated that with the addition of a single gate, such as an XOR or XNOR gate 320, speed performance of shift registers may be measured. Moreover, shift register circuits under test may be tested with a built-in self-test ring oscillator or with a configured-in self-test ring oscillator in the example of programmably configurable logic. Returning to FIG. 3, XOR gate 320 and flip-flops 294 and 295 may be dedicated circuits programmably coupled and decoupled to shift register 302 via programmable interconnect points ("PIPs") 384 through 387, where shift register 302 is formed from dedicated circuitry or programmably configurable circuitry or a combination thereof. Alternatively, XOR gate 320 and flip-flops 294 and 295 may be circuits formed of programmably configurable logic programmably coupled and decoupled to shift register 302 via PIPs 384 through 387, where shift register 302 is formed from dedicated circuitry or programmably configurable circuitry or a combination thereof. Notably, a shift register may be instantiated in at least one CLB of an FPGA.

It should be appreciated that by having shift register 302 configured with a 1010 . . . data pattern for example where the leftmost bit is an LSB and the rightmost bit is an MSB, the MSB is fed back as an input to XOR 320, and to a data shift input port of shift register 302. An initial logic 0 for an MSB provides the opposite of what is currently the LSB for a next clock cycle to yield a 0101 . . . data pattern. Because the previous logic 0 MSB is subsequently shifted into the LSB position, all other bits are shifted along. For a subsequent clock cycle for a logic 1 in the MSB position, the 1010 . . . data pattern is repeated. Thus, the data patterns 1010 . . . and 0101 . . . alternate from clock cycle to clock cycle. Accordingly, a data pattern may be configured in shift register 302 such that shift register 302 provides its own inversion thereby omitting an inversion operation.

Accordingly, it should be appreciated that propagation delay of a shift register, or a chain of shift registers, may be determined with one-to-one correspondence between an input rising edge and an output rising edge, or with one-to-one correspondence between an input falling edge and an output falling edge, without having to clear the shift register and add a value. In other words, a shift register circuit is configured to be non-inverting. This is in part achieved by having a rising edge of a data input signal translated into a clock pulse and a falling edge of the data input signal translated into another clock pulse. Moreover, having to effect a ganged set/reset within a limited time window may be avoided; correspondingly, likelihood of a race condition is substantially reduced. It should be appreciated that by having only a single XOR gate and to some extent signal propagation delay due to feedback loop trace, very little delay may be added into the testing of a shift register. In other words, the actual performance of the shift register in terms of signal propagation delay may be more closely understood, as there are very few elements within the shift register circuit under test that add to the signal propagation delay.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit configured for testing signal propagation delay, comprising:
   a ring oscillator having a first sequential element, a second sequential element, and a shift register circuit, the shift register circuit coupled in series between the first sequential element and the second sequential element, the shift register circuit including at least one shift register and combinational logic coupled to the at least one shift register;
   the first sequential element and the second sequential element being part of another shift register circuit in which the shift register circuit is inserted;
   an initial sequential element of the other shift register circuit, the initial sequential element preceding the first sequential element;
   the at least one shift register configured to store a test data pattern of alternating logic ones and zeros;
   the combinational logic coupled to receive a data signal from the first sequential element of the ring oscillator and coupled to receive a shift output signal from the at least one shift register, the combinational logic configured to provide an exclusive OR or an exclusive NOR function;
   the at least one shift register coupled to receive output from the combinational logic to clock the at least one shift register;
   the at least one shift register coupled to receive the shift output signal from the at least one shift register as a fed back shift input signal; and
   the second sequential element coupled to receive the shift output signal to clock the second sequential element.

2. The integrated circuit according to claim 1, wherein the first sequential element and the second sequential element are respective flip-flops.

3. The integrated circuit according to claim 2, wherein the combinational logic is an exclusive-OR gate.

4. The integrated circuit according to claim 3, wherein the at least one shift register is a rising-edge-triggered shift register.

5. The integrated circuit according to claim 1, wherein the at least one shift register includes a write activation port, the write activation port being coupled to a voltage level to maintain the at least one shift register in a write activated state.

6. The integrated circuit according to claim 5, wherein at least a portion of the ring oscillator is configured from programmably configurable logic.

7. The integrated circuit according to claim 6, wherein the first sequential element, the second sequential element, and the combinational logic are configured from programmably configurable logic, and wherein the at least one shift register is configured from non-programmably configurable logic.

8. The integrated circuit according to claim 7, wherein the at least one shift register is programmably coupled and decoupled to the first sequential element, the second sequential element, and the combinational logic via programmable interconnect points.

9. The integrated circuit according to claim 8, wherein the programmable interconnect points are part of a programmable logic device.

10. The integrated circuit according to claim 9, wherein the programmable logic device is a Field Programmable Gate Array.

11. The integrated circuit according to claim 2, wherein the combinational logic is an exclusive-NOR gate.

12. The integrated circuit according to claim 11, wherein the at least one shift register is a falling-edge-triggered shift register.

13. The integrated circuit according to claim 6, wherein the first sequential element, the second sequential element, the combinational logic, and the at least one shift register are configured from programmably configurable logic.

14. The integrated circuit according to claim 13, wherein the at least one shift register is programmably coupled and decoupled to the first sequential element, the second sequential element, and the combinational logic via programmable interconnect points.

15. The integrated circuit according to claim 14, wherein the programmably configurable logic used to provide the at least one shift register includes at least one configurable logic block.

16. The integrated circuit according to claim 15, wherein the at least one configurable logic block is part of a programmable logic device.

17. An integrated circuit configured for signal testing propagation delay of at least a portion of a chain of shift registers, comprising:
   a ring oscillator having a first sequential element, a second sequential element, and a chain of shift register circuits, the chain of shift register circuits being respective shift register circuits coupled in series between the first sequential element and the second sequential element, each of the shift register circuits including at least one shift register and combinational logic coupled to the at least one shift register;
   the first sequential element and the second sequential element being part of a test platform shift register in which the chain of shift register circuits is inserted;
   an initial sequential element of the test platform shift register preceding the first sequential element;
   the at least one shift register of each of the shift register circuits configured to store a test data pattern of alternating logic ones and zeros;
   the combinational logic of each of the shift register circuits coupled to receive a respective data signal and coupled to receive a respective shift output signal from the at least one shift register associated with a shift register circuit of the shift register circuits in which the combinational logic is located;
   an initial shift register circuit in the chain of shift register circuits coupled to receive the respective data signal from a data output port of the first sequential element of the ring oscillator;
   each subsequent shift register circuit to the initial shift register circuit in the chain of shift register circuits coupled to receive the respective data signal from an immediately previous one of the shift register circuits in the chain of shift register circuits;

the at least one shift register of each of the shift register circuits coupled to receive output from the combinational logic associated therewith to clock the at least one shift register;

the at least one shift register of each of the shift register circuits respectively coupled to receive the shift output signal from the at least one shift register as a respective fed back shift input signal; and the second sequential element coupled to receive the shift output signal of a last shift register circuit in the chain of shift register circuits to a clock port of the second sequential element.

18. The integrated circuit of claim 17 wherein the combinational logic comprises an exclusive OR gate.

19. A method for testing signal propagation delay of a shift register, comprising:

programmably configuring a configurable logic block to provide a shift register;

programmably coupling the shift register to combinational logic configured to provide an exclusive logic function, the exclusive logic function being selected from an exclusive-OR function and an exclusive-NOR function, the shift register and the combinational logic in combination forming a test circuit;

programmably coupling the test circuit between a first sequential element and a second sequential element to provide at least a portion of a ring oscillator, the first sequential element and the second sequential element forming a portion of a test platform shift register in which the test circuit is located;

an initial sequential element of the test platform shift register preceding the first sequential element;

initializing the shift register with a test pattern;

sending a data input signal from the first sequential element to a first input of the combinational logic;

sending a shift output signal from the shift register to a shift input port of the shift register, to a second input of the combinational logic, and to a clock port of the second sequential element;

generating a clock signal from output of the combinational logic responsive to the shift output signal and the data input signal; and clocking the shift register responsive to the clock signal.

20. The method according to claim 19, wherein the shift register is configured to be in a write active state.

* * * * *